United States Patent
Kurachi et al.

(10) Patent No.: US 8,178,900 B2
(45) Date of Patent: May 15, 2012

(54) SEMICONDUCTOR DEVICE HAVING GAN-BASED SEMICONDUCTOR LAYER AND SELECT COMPOSITION RATIO INSULATING FILM

(75) Inventors: Shunsuke Kurachi, Nakakoma-gun (JP); Tsutomu Komatani, Nakakoma-gun (JP)

(73) Assignee: Eudyna Devices Inc., Yamanashi (JP)

( * ) Notice: Subject to any disclaimer, the term of this patent is extended or adjusted under 35 U.S.C. 154(b) by 301 days.

(21) Appl. No.: 11/392,785

(22) Filed: Mar. 30, 2006

(65) Prior Publication Data
US 2006/0220063 A1 Oct. 5, 2006

(30) Foreign Application Priority Data
Mar. 30, 2005 (JP) .................. 2005-096902

(51) Int. Cl.
*H01L 31/072* (2012.01)
*H01L 31/109* (2006.01)
*H01L 31/0328* (2006.01)

(52) U.S. Cl. .......... 257/194; 257/183; 257/192
(58) Field of Classification Search .......... 257/183, 257/192–194, 201, E29.247–252
See application file for complete search history.

(56) References Cited

U.S. PATENT DOCUMENTS
2001/0028100 A1  10/2001  Schmitz et al.
2004/0144991 A1*  7/2004  Kikkawa ................... 257/103
2005/0170574 A1*  8/2005  Sheppard et al. ............ 438/172
2006/0138457 A1*  6/2006  Otsuka et al. ................ 257/194

FOREIGN PATENT DOCUMENTS
| JP | 11-233731 A | 8/1999 |
| JP | 2001-077353 A | 3/2001 |
| JP | 2003-229439 A | 8/2003 |
| JP | 2004-200248 A | 7/2004 |
| JP | 2004-221325 A | 8/2004 |
| WO | WO 2005/024955 A1 | 3/2005 |

OTHER PUBLICATIONS

Tan, W.S. et al., "Comparison of Different Surface Passivation Dielectrics in AlGaN/GaN Heterostructure Field-Effect Transistors," Journal of Physics D: Applied Physics, Mar. 19, 2002, pp. 595-598, vol. 35, No. 7, Institute of Physics Publishing, Bristol, Great Britain.

(Continued)

*Primary Examiner* — Cuong Q Nguyen
(74) *Attorney, Agent, or Firm* — Westerman, Hattori, Daniels & Adrian, LLP (57) ABSTRACT

A semiconductor device includes a GaN-based semiconductor layer formed on a substrate, and an insulating film composed of any one of silicon nitride in which the composition ratio of silicon to nitrogen is 0.85 to 3.0, silicon oxide in which the composition ratio of silicon to oxygen is 0.6 to 3.0, or silicon oxide nitride in which the composition ratio of silicon to nitrogen and oxygen is 0.6 to 3.0 that is formed on a surface of the GaN-based semiconductor layer, a gate electrode formed on the GaN-based semiconductor layer, and a source electrode and a drain electrode formed with the gate electrode therebetween.

1 Claim, 3 Drawing Sheets

OTHER PUBLICATIONS

Arulkumaran, S. et al., "Surface Passivation Effects on AlGaN/GaN High-Electron-Mobility Transistors with $SiO_2$, $Si_3N_4$, and Silicon Oxynitride," Applied Physics Letter, Jan. 26, 2004; pp. 613-615, vol. 84, No. 4, American Institute of Physics, Melville, New York.

Hwang, Heonghyun et al., "Effects of a Molecular Beam Epitaxy Grown AlN Passivation Layer on AlGaN/GaN Heterojunction Field Effect Transistors," Solid-State Electronics, Feb. 2004, pp. 363-366, vol. 48, No. 2 Elsevier Science Publishers, Barking, Great Britain.

European Search Report dated Apr. 24, 2008; in corresponding European Application No. 06 25 1792.

Japanese Office Action dated Sep. 6, 2011, issued in corresponding Japanese Patent Application No. 2005-096902.

* cited by examiner

SEMICONDUCTOR DEVICE HAVING GAN-BASED SEMICONDUCTOR LAYER AND SELECT COMPOSITION RATIO INSULATING FILM

BACKGROUND OF THE INVENTION

1. Field of the Invention

The present invention relates to a semiconductor device, a fabricating method thereof, a substrate used to fabricate the semiconductor device, and a fabricating method thereof. More particularly, the present invention relates to a nitride semiconductor device, a fabricating method thereof, a substrate used to fabricate the semiconductor device, and a fabricating method thereof.

2. Description of the Related Art

A nitride semiconductor, particularly a semiconductor device using gallium nitride (GaN), is used as a power device operating at a high frequency and high output. In particular, a high electron mobility transistor (HEMT) is known as a semiconductor device suitable for performing amplification of high-frequency bandwidths in microwaves, quasi-millimeter waves, millimeter waves, etc. Technology enabling the HEMT to operate under high drain voltage is being developed to allow operation of the HEMT at a higher output.

The nitride semiconductor is a compound of nitrogen (N), that is a Group V element, and a Group III element. Examples thereof are gallium nitride (GaN), aluminum nitride (AlN), and indium nitride (InN). HEMTs that use a nitride semiconductor (hereinafter, nitride semiconductor HEMT) including a GaN layer and an AlGaN layer, composed of a GaN and AlN mixed crystal, are disclosed in Patent Reference 1 (Japanese Patent Application Publication No. 2004-200248, FIG. 1), Patent Reference 2 (Japanese Patent Application Publication No. 2003-229439, FIG. 1), and Patent Reference 3 (Japanese Patent Application Publication No. 2001-77353, FIG. 1).

In Patent Reference 1, a nitride semiconductor HEMT is disclosed, in which an AlGaN electron supply layer is formed on a GaN channel layer, and a gate electrode, a source electrode, and a drain electrode are formed on the AlGaN electron supply layer. Here, a semiconductor surface layer between the gate electrode and the drain electrode is an AlGaN layer.

In Patent Reference 2, a nitride semiconductor HEMT is disclosed, in which a GaN electron accumulation layer is formed on an AlGaN electron supply layer, and a gate electrode, a source electrode, and a drain electrode are formed on the GaN electron accumulation layer. Here, the semiconductor surface layer between the gate electrode and the drain electrode is a GaN layer.

In Patent Reference 3, a nitride semiconductor HEMT is disclosed, in which an AlGaN electron supply layer is formed on a GaN channel layer, a gate electrode is formed on the AlGaN electron supply layer, and a source electrode and a drain electrode are formed on the AlGaN electron supply layer, via a GaN contact layer. Here, the semiconductor surface layers between the gate electrode and the drain electrode are the GaN layer and the AlGaN layer.

Figure 1:
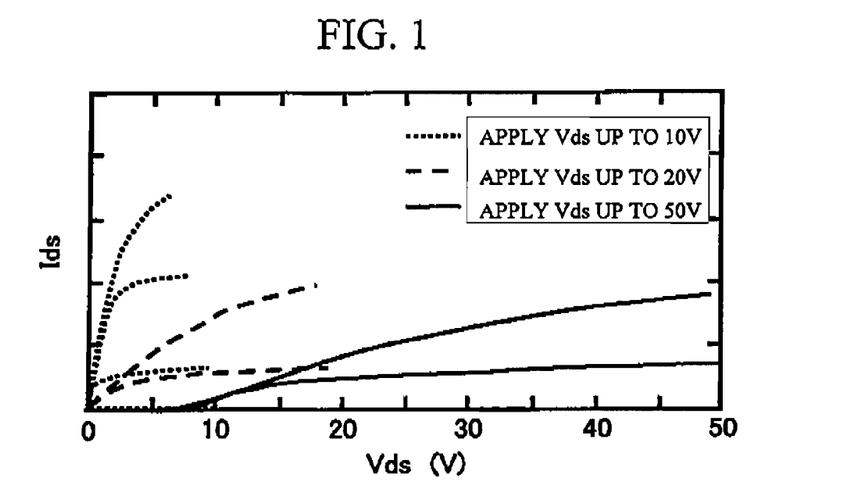
FIG. 1 is a diagram of electrical characteristics of a conventional example.

However, in a conventional nitride semiconductor HEMT, a phenomena where drain current decreases (collapse phenomenon) becomes a problem when high drain voltage is applied. An explanation of the collapse phenomenon is as follows. FIG. 1 shows drain current (Ids)-drain voltage (Vds) characteristics when 10 V, 20 V, and 50 V are sequentially applied to the nitride semiconductor HEMT (conventional example) as the drain voltage. The drain current when a drain voltage of 20 V is applied decreases compared to the drain current when a drain voltage of 10 V is applied. Further, when a drain voltage of 50 V is applied, the drain current is approximately half of the drain current obtained when the drain voltage is 10 V. In a HEMT as such, a drain voltage of 20 V or more cannot be applied, and thus, high output operations are difficult.

SUMMARY OF THE INVENTION

It is therefore an object of the present invention to provide a semiconductor device that can inhibit a collapse phenomenon that occurs when high drain voltage is applied and is capable of high output operations, a fabricating method thereof, a substrate used to fabricate the semiconductor device, and a fabricating method thereof.

According to an aspect of the present invention, there is provided a semiconductor device including a GaN-based semiconductor layer formed on a substrate; an insulating film formed on a surface of the GaN-based semiconductor layer, and composed of any one of silicon nitride in which the composition ratio of silicon to nitrogen is 0.85 to 3.0, silicon oxide in which the composition ratio of silicon to oxygen is 0.6 to 3.0, or silicon oxide nitride in which the composition ratio of silicon to nitrogen and oxygen is 0.6 to 3.0; a gate electrode formed on the GaN-based semiconductor layer; and a source electrode and a drain electrode formed with the gate electrode therebetween. It is thus possible to reduce an oxide of a Group III element that is formed within a semiconductor surface layer between the gate electrode and the drain electrode and causes the collapse phenomenon, and to inhibit the collapse phenomenon. Thus, a semiconductor device capable of high output operations can be provided.

According to another aspect of the present invention, there is provided a semiconductor device including a GaN-based semiconductor layer formed on a substrate; an insulating film formed on the surface of the GaN-based semiconductor layer, and composed of either aluminum nitride in which the composition ratio of aluminum to nitrogen is 1.2 to 2.0 or aluminum oxide in which the composition ratio of aluminum to oxygen is 0.7 to 2.0; a gate electrode formed on the GaN-based semiconductor layer; and a source electrode and a drain electrode formed with the gate electrode therebetween. Thus, a semiconductor device capable of high output operations can be provided.

According to yet another aspect of the present invention, there is provide a method of fabricating a semiconductor device, including forming a GaN-based semiconductor layer on a substrate, forming an insulating film on a surface of the GaN-based semiconductor layer by CVD, the insulating film being composed of any one of silicon nitride in which the composition ratio of silicon to nitrogen is 0.85 to 3.0, silicon oxide in which the composition ratio of silicon to oxygen is 0.6 to 3.0, or silicon oxide nitride in which the composition ratio of silicon to nitrogen and oxygen is 0.6 to 3.0, forming a gate electrode on the GaN-based semiconductor layer, and forming a source electrode and a drain electrode with the gate electrode therebetween. It is thus possible to reduce an oxide of a Group III element that is formed within a semiconductor surface layer between the gate electrode and the drain electrode and causes the collapse phenomenon, and to inhibit the collapse phenomenon. Thus, a fabricating method of a semiconductor device capable of high output operations can be provided.

According to a further aspect of the present invention, there is provided a method of fabricating a semiconductor device including forming a GaN-based semiconductor layer on a substrate; forming an insulating film on the surface of the GaN-based semiconductor layer, the insulating film being composed of either aluminum nitride in which the composition ratio of aluminum to nitrogen is 1.2 to 2.0 or aluminum oxide in which the composition ratio of aluminum to oxygen is 0.7 to 2.0; forming a gate electrode on the GaN-based semiconductor layer; and forming a source electrode and drain electrode with the gate electrode therebetween. It is thus possible to reduce an oxide of a Group III element that is formed within a semiconductor surface layer between the gate electrode and the drain electrode and causes the collapse phenomenon, and to inhibit the collapse phenomenon. Thus, a fabricating method of a semiconductor device capable of high output operations can be provided.

The insulating film may be composed of silicon nitride and may be formed with a silane ($SiH_4$) gas flow rate of 4 to 15 sccm, an ammonia ($NH_3$) gas flow rate of 0 to 8 sccm, and a nitrogen ($N_2$) gas flow rate of 20 to 200 sccm. The insulating film may be composed of aluminum nitride and may be formed with an Ar gas flow rate of 20 to 100 sccm by sputtering with aluminum nitride as a target. The insulating film may be formed to be 10 nm or more. The GaN-based semiconductor layer may be formed using a metal organic chemical vapor deposition (MOCVD) method.

According to a still further aspect of the present invention, there is provided a substrate used to fabricate a semiconductor device including a GaN-based semiconductor layer formed on a base substrate, and an insulating film, composed of any one of silicon nitride in which the composition ratio of silicon to nitrogen is 0.85 to 3.0, silicon oxide in which the composition ratio of silicon to oxygen is 0.6 to 3.0, or silicon oxide nitride in which the composition ratio of silicon to nitrogen and oxygen is 0.6 to 3.0, formed on a surface of the GaN-based semiconductor layer. It is thus possible to reduce an oxide of a Group III element that is formed within the semiconductor layer between the gate electrode and the drain electrode and causes the collapse phenomenon, and to inhibit the collapse phenomenon. Thus, a substrate used to fabricate a semiconductor device that is used to fabricate a semiconductor device capable of high output operations can be provided. Furthermore, a substrate used to fabricate a semiconductor device that is suitable for storage can be provided.

According to another aspect of the present invention, there is provided a substrate used to fabricate a semiconductor device including a GaN-based semiconductor layer formed on a base substrate, and an insulating film, composed of either aluminum nitride in which the composition ratio of aluminum to nitrogen is 1.2 to 2.0 or aluminum oxide in which the composition ratio of aluminum to oxygen is 0.7 to 2.0, formed on the surface of the GaN-based semiconductor layer. In accordance with the present invention, an oxide of a Group III element that is formed within the semiconductor surface layer between the gate electrode and the drain electrode and causes the collapse phenomenon can be reduced, thereby inhibiting the collapse phenomenon. Thus, a substrate used to fabricate a semiconductor device that is used to fabricate of a semiconductor device capable of high output operations can be provided. Furthermore, a substrate used to fabricate a semiconductor device that is suitable for storage can be provided.

According to another aspect of the present invention, there is provided a method of fabricating a substrate used to fabricate a semiconductor device including a step of forming a GaN-based semiconductor layer on a substrate, and a step of forming an insulating film, composed of any one of silicon nitride in which the composition ratio of silicon to nitrogen is 0.85 to 3.0, silicon oxide in which the composition ratio of silicon to oxygen is 0.6 to 3.0, or silicon oxide nitride in which the composition ratio of silicon to nitrogen and oxygen is 0.6 to 3.0, on the surface of the GaN-based semiconductor layer using a plasma chemical vapor deposition (CVD) method. In accordance with the present invention, an oxide of a Group III element that is formed within the semiconductor layer between the gate electrode and the drain electrode and causes the collapse phenomenon can be reduced, thereby inhibiting the collapse phenomenon. Thus, a fabricating method of a substrate used to fabricate a semiconductor device that is used to fabricate a semiconductor device capable of high output operations can be provided. Furthermore, a fabricating method of a substrate used to fabricate a semiconductor device that is suitable for storage can be provided.

According to another object of the present invention, there is provided a fabricating method of a substrate used to fabricate a semiconductor device including a step of forming a GaN-based semiconductor layer on a substrate, and a step of forming an insulating film, composed of either aluminum nitride in which the composition ratio of aluminum to nitrogen is 1.2 to 2.0 or aluminum oxide in which the composition ratio of aluminum to oxygen is 0.7 to 2.0, on the surface of the GaN-based semiconductor layer using a plasma chemical vapor deposition (CVD) method. In accordance with the present invention, an oxide of a Group III element that is formed within the semiconductor surface layer between the gate electrode and the drain electrode and causes the collapse phenomenon can be reduced, thereby inhibiting the collapse phenomenon. Thus, a fabricating method of a substrate used to fabricate a semiconductor device that is used to fabricate of a semiconductor device capable of high output operations can be provided. Furthermore, a fabricating method of a substrate used to fabricate a semiconductor device that is suitable for storage can be provided.

In accordance with the present invention, the insulating film layer formed on the semiconductor surface layer reduces the oxide of the Group III element that is formed on the insulating film interface within the semiconductor surface layer, thereby inhibiting the collapse phenomenon that occurs when a high drain voltage is applied. As a result, a semiconductor device capable of high output operations, a fabricating method thereof, a substrate used to fabricate the semiconductor device, and a fabricating method thereof can be provided.

DESCRIPTION OF THE PREFERRED EMBODIMENTS

Figure 2:
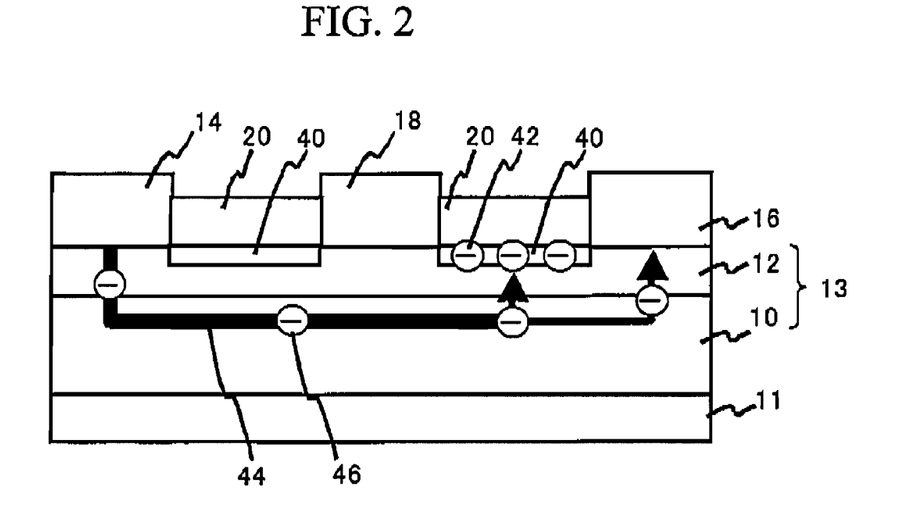
FIG. 2 is a diagram explaining a cause of a collapse phenomenon.

The inventors of the present invention speculated on a cause of collapse phenomena, as follows. FIG. 2 is a cross-sectional pattern diagram of a HEMT in accordance with a conventional example that explains the cause of the collapse phenomenon. A semiconductor layer 10, including a GaN channel layer and an AlGaN electron supply layer, and a GaN cap layer that is a semiconductor surface layer 12 are formed on a sapphire substrate or a SiC substrate 11 as a GaN-based semiconductor layer 13. An insulating film 20 is formed on the surface of the GaN-based semiconductor layer 13. Furthermore, an opening is provided in a predetermined area of the insulating film 20, and a gate electrode 18 is formed on the GaN-based semiconductor layer 13 in the opening. Still further, a source electrode 14 and a drain electrode 16 are formed with the gate electrode 18 therebetween.

At this time, an oxide 40 of a Group III element composing the semiconductor surface layer 12 is present on the surface of the semiconductor layer facing the insulating film 20. A flow 44 of electrons 46 that is a drain current flows from the source electrode 14 to the drain electrode 16. For some reason, a portion of the electrons 46 is captured by the oxide 40 between the gate electrode 18 and the drain electrode 16, when high drain voltage is applied. Thus, the drain current is reduced. Here, the mechanism by which the electrons are captured due to high electrical field is not clear. However, it is thought that, for example, an electron trap 42 is induced within the oxide 40 by the high electrical field during the application of the high drain voltage. It is also thought that, due to the high electrical field, electrons become hot and pass through a surface depletion layer and are capture by the electron trap 42 within the oxide 40. In any case, it is inferred that the collapse phenomenon is caused by the oxide 40 present on the surface of the semiconductor layer facing the insulating film 20. Thus, the inventors of the present invention have focused on standard free energy of formation as a means of reducing the oxide of the Group III element within the semiconductor surface layer.

Standard free energy of formation of the oxides of gallium (Ga), aluminum (Al), indium (In), and silicon (Si) are as follows. $Ga_2O_3$ is −499 kJ/mole. $Al_2O_3$ is −791 kJ/mole. $In_2O_3$ is −419 kJ/mole. $SiO_2$ is −857 kJ/mole. The standard free energy of formation indicates the ease with which a reaction progresses. The larger a value is in the negative direction, the more proactively the reaction progresses to form the composition.

$SiO_2$ has the smallest standard free energy of formation. If the semiconductor surface layer 12 is a GaN layer, for example, $Ga_2O_3$ can be considered as the oxide thereof. The GaN layer that is the semiconductor surface layer 12 has excessive Ga due to nitrogen depletion. Therefore, Ga reacts with oxygen in the atmosphere and an oxide such as $Ga_2O_3$ is formed. If a silicon nitride film that has a larger silicon (Si) content than the stoichiometric amount of Si in silicon nitride film ($Si_3N_4$) is formed on the GaN layer, excess silicon (silicon in which excess bond joins hydrogen and forms an Si—H group) within the silicon nitride film reacts with the oxygen in $Ga_2O_3$ that is the oxide within the GaN layer, and the silicon per se is oxidized. It is thought that, as a result, the oxide $Ga_2O_3$ can be reduced.

Figure 3:
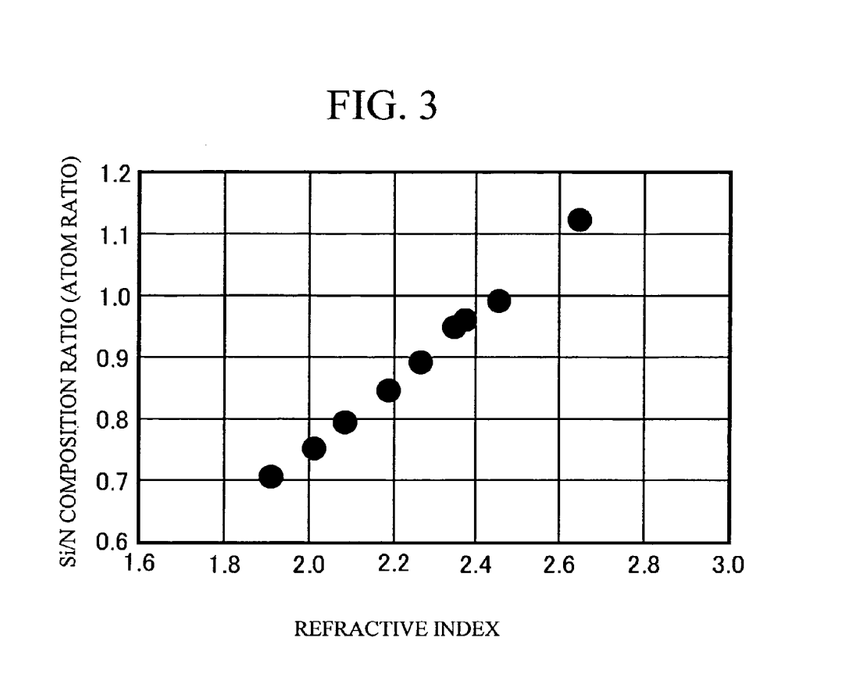
FIG. 3 is a diagram showing a relationship between the refractive index and the composition ratio of silicon/nitrogen of a silicon nitride film.

FIG. 3 is a diagram of a correlation between refractive index within the silicon nitride film and the composition ratio (atom ratio) of silicon to nitrogen within the silicon nitride (silicon/nitrogen composition ratio). When the refractive index is a value slightly smaller than 2.0, the silicon and the nitrogen have a stoichiometric value of 0.75. Therefore, if the refractive index is 2.0 or more, the silicon within the silicon nitride film will be more excessive than in a stoichiometric silicon nitride film.

Thus, a semiconductor device having the same structure as that in a first embodiment described hereafter where the insulating film layer 25 is a silicon nitride film layer with a refractive index of 2.05 and that with a refractive index of 2.20 were fabricated.

TABLE 1 is results of an energy dispersive X-ray fluorescence analysis (EDX analysis) of the vicinity of the interface between the semiconductor surface layer 12 and the insulating film layer 25, in the semiconductor device where the insulating film layer 25 is the silicon nitride film layer with the refractive index of 2.05 and in the semiconductor device where the insulating film layer 25 is the silicon nitride film layer with the refractive index of 2.20. The analysis is performed on two areas, an area 30 on the insulating film side of the interface between the semiconductor surface layer 12 and the insulating film layer 25 and an area 32 on the semiconductor surface layer side thereof. Here, the percentages of each element indicate signal strength, not the composition ratio.

TABLE 1

| | Refractive Index of Silicon Nitride Film | | | |
| --- | --- | --- | --- | --- |
| | 2.05 | | 2.20 | |
| | Analysis area | | | |
| | Area 30 | Area 32 | Area 30 | Area 32 |
| Nitrogen (N) | 5.7% | 2.1% | 2.1% | 1.9% |
| Oxygen (O) | 0.5% | 1.7% | 1.3% | 0.7% |
| Silicon (Si) | 82.5% | 3.6% | 41.4% | 6.6% |
| Gallium (Ga) | 11.3% | 92.6% | 55.2% | 90.8% |

In the semiconductor device having the silicon nitride film layer with the refractive index of 2.05, more oxygen and gallium are detected in the area 32 on the semiconductor surface layer side than in the area 30 on the insulating film layer side. Thus, it is thought that gallium oxide is formed within the semiconductor surface layer.

At the same time, in the semiconductor device having the silicon nitride film layer with the refractive index of 2.20, the oxygen in the area 32 on the semiconductor surface layer side is decreased, compared to the semiconductor device having the silicon nitride film layer with the refractive index of 2.05. In addition, the oxygen in the area 30 on the insulating film layer side is increased. Thus, it is thought that, because the refractive index of the silicon nitride film layer is 2.20, the excess silicon (namely, Si—H) within the silicon nitride film layer reacts with the oxygen in the gallium oxide within the semiconductor surface layer, and as a result, the gallium oxide is reduced.

By forming a silicon nitride film with a refractive index of 2.2 or more, or in other words, with a silicon/nitrogen composition ratio of 0.85 or more, on the semiconductor surface layer 12 as such, the oxide of the Group III element within the semiconductor surface layer 12 can be reduced. Here, the refractive index is preferably 2.2 or more, rather than 2.0, because a certain amount of excess silicon (Si—H group) is required to reduce the gallium oxide.

First Embodiment

A first embodiment is an example of the nitride semiconductor HEMT in which a silicon nitride film layer with a refractive index of 2.2 to 2.3, or in other words, with a silicon/nitrogen composition ratio of 0.85 to 0.9, is formed on the semiconductor surface 12 as the insulating film layer 25.

Figure 4:
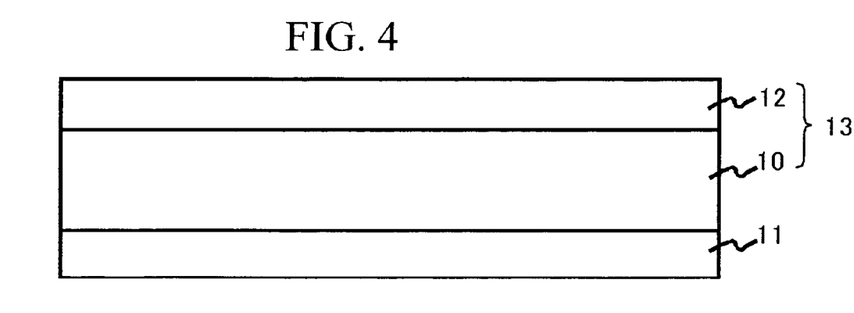
FIG. 4 is a cross-sectional diagram of a HEMT fabricating procedure according to a first embodiment.

Hereafter, a fabricating method of the nitride semiconductor HEMT is explained. In FIG. 4, an impurity-free GaN electron transit layer serving as the GaN-based semiconductor layer 13, the semiconductor layer 10 including an Si-added, N-type AlGaN electron supply layer, and a GaN cap layer serving as the semiconductor surface layer 12 are formed on, for example, the SiC substrate 11 using the MOCVD method. Thus, an epitaxial substrate is completed. The silicon nitride film layer with the refractive index of 2.2 to 2.3 is formed on the surface of the semiconductor surface layer 12 as an insulating film layer 25. This silicon nitride film has a silicon/nitride composition ratio of 0.85 to 0.9. A substrate used to fabricate a semiconductor is completed as such. A substrate composed of any one of SiC, Si, sapphire, or a GaN-based semiconductor can be used as the substrate 11. A GaN-based semiconductor layer 13 with high crystallizability can be formed. The GaN-based semiconductor 13 is a semiconductor composed of any one of, for example, GaN, AlGaN, or InGaN. In the first embodiment, the GaN-based semiconductor layer 13 is composed of a GaN layer and an AlGaN layer.

The silicon nitride film serving as the insulating film layer 25 is formed using a plasma CVD device, under a condition where, for example, flow rate of silane ($SiH_4$) gas is 4.0 to 15 sccm, flow rate of ammonia ($NH_3$) gas is 0 to 8 sccm, flow rate of nitrogen ($N_2$) gas is 20 to 200 sccm, and high frequency power density is 0.04 to 0.24 W/cm$^2$. Here, for example, silicon content and the refractive index can be increased by lowering the flow rate of the $NH_3$ gas. The desired silicon content and refractive index can be attained by setting the high frequency power density to a predetermined value. In the present embodiment, the refractive index is 2.2 to 2.3 and the silicon/nitrogen composition ratio is 0.85 to 0.9. A parallel plate type plasma CVD device, an inductively-coupled plasma (ICP) type CVD device, or an electron cyclotron resonance (ECR) type CVD device can be used as the plasma CVD device. In addition, the insulating film layer 25 can be formed using a sputter device under a condition where, for example, the Ar gas flow rate percentage is 20% to 80% and the high frequency power is 50 to 500 W. The desired insulating film layer 25 can be formed easily by using the CVD device or the sputtering device to form the insulating film layer 25.

The thickness of the insulating film layer 25 used is 200 nm to 300 nm. In order to achieve the effect of reducing oxide on the surface of the semiconductor surface layer 12, the film thickness of the insulating film layer 25 is preferably 10 nm or more.

Figure 5:
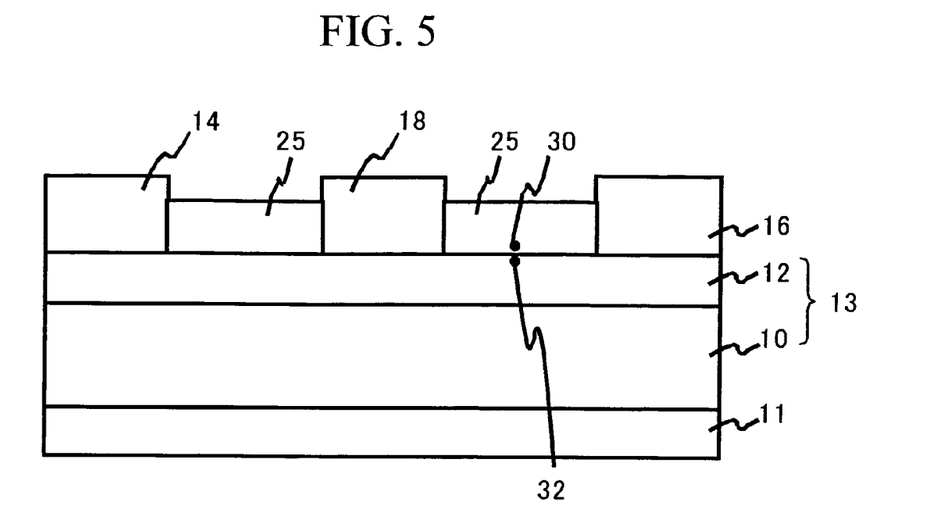
FIG. 5 is a cross-sectional diagram of a HEMT according to the first embodiment.

Next, in FIG. 5, the insulating film layer 25 of a predetermined area is selectively etched using a dry-etching method and the gate electrode 18 is formed on the semiconductor surface layer 12. The gate electrode 18 is, for example, Ni/Al or Ni/Au and is formed by an evaporation method or a lift-off method. The insulating film layer 25 of a predetermined area is selectively etched using the dry-etching method and the source electrode 14 and the drain electrode 16 are formed with the gate electrode 18 therebetween. The source electrode 14 and the drain electrode 16 are, for example, Ti/Al or Ti/Au and are formed by an evaporation method or a lift-off method. The nitride semiconductor HEMT in accordance with the first embodiment is completed as such.

Figure 6:
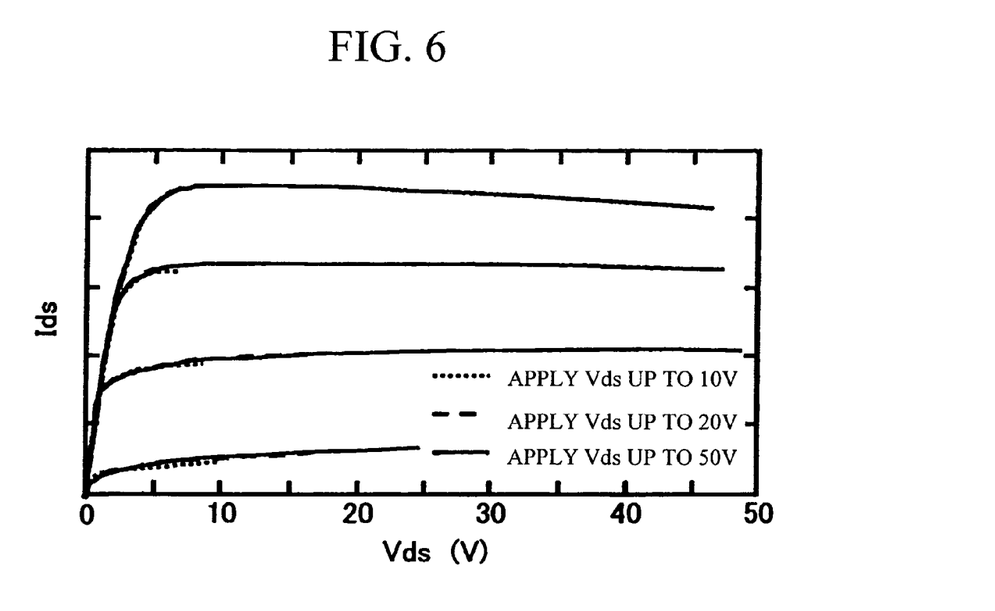
FIG. 6 is a diagram of electrical characteristics of the first embodiment.

FIG. 6 shows the drain current (Ids)-drain voltage (Vds) characteristics when 10 V, 20 V, and 50 V are sequentially applied to the HEMT, created as described above, as the drain voltage. The curves of the drain currents almost match when any drain voltage is applied, and the collapse phenomenon does not occur.

In this way, in the nitride semiconductor HEMT in accordance with the first embodiment, the oxide of the Group III element within the semiconductor surface layer 12 is reduced by forming a silicon nitride film layer with more silicon than the stoichiometric composition on the semiconductor surface layer 12, between the gate electrode 18 and the drain electrode 16, as the insulating film layer 25. Thus, the collapse phenomenon is inhibited. As a result, in the HEMT in accordance with the first embodiment, a semiconductor device capable of high output operations can be provided. Although an example of the nitride semiconductor HEMT is shown in the first embodiment, the same effects can be attained with a metal semiconductor field effect transistor (MESFET).

In addition, in the substrate used to fabricate a semiconductor device, shown in FIG. 4, the insulating film layer 25 functions to protect the surface of the epitaxial substrate. The epitaxial substrates, in which various semiconductor layers are formed on the substrate, are made and stocked in advance and the remaining procedures are performed when fabricating is required. Alternatively, fabricators that do not have epitaxial overgrowth techniques use the substrates through purchase from outside fabricators. Therefore, the epitaxial substrate is exposed to external atmosphere for an extended period of time, and during this time, oxidation of the surface progresses. By forming the insulating film layer 25 on the surface of the epitaxial substrate, the substrate will not be exposed to the external atmosphere for an extended period of time. As a result, the formation of oxides that degrade the characteristics of the semiconductor device on the surface of the GaN-based semiconductor layer 13 can be prevented. In the insulating film layer 20 with a stoichiometric composition, which is used in the conventional example, there was no function for reducing oxides. However, the substrate used to fabricate the semiconductor device that is for fabricating the semiconductor device in accordance with the first embodiment can reduce the oxide formed on the semiconductor surface layer 12 by providing the insulating film 25. Thus, the formation of oxide that degrades the characteristics of the semiconductor device on the surface of the GaN-based semiconductor layer 13 can be prevented.

In the present embodiment, an example where a silicon nitride film layer with a refractive index of 2.1 to 2.2 is used as the insulating film layer 25 is shown. The effect of the insulating film layer 25 on the reduction of the oxide formed within the semiconductor surface layer 12 is greater when the refractive index of the silicon nitride film layer is larger, or in other words, when the content of silicon in the silicon nitride film is greater. In other words, insulating films with a larger refractive index, namely a larger composition ratio of silicon to nitrogen, have a greater effect. However, if the silicon/nitride composition ratio exceeds 3.0, for example, silicon reacts with the oxygen in the atmosphere and the reaction with the oxide under the silicon nitride film is reduced. Furthermore, if the silicon/nitride composition ratio exceeds 3.0, band gap is dramatically reduced, the insulating film takes on characteristics of a metal rather than an insulating film, and becomes amorphous silicon. Therefore, the silicon/nitrogen composition ratio is preferably less than 3.0.

As explained above, the silicon/nitrogen composition ratio of the silicon nitride film (the composition ratio of silicon to nitrogen) is preferably 0.85 or more, such that the composition of silicon is greater than the stoichiometric composition. If the composition ratio is smaller than 0.85, for example, the density of the Si—H group is insufficient for $Ga_2O_3$ abstraction, and the effect of inhibiting the collapse phenomenon is reduced. In addition, from the explanation above, the silicon/nitrogen composition ratio is preferably less than 3.0, and more preferably, 1.0 to 3.0.

In the present embodiment, an example where the GaN layer is the semiconductor surface layer 12 is shown. However, taking into consideration the standard free energy of formation explained earlier, the example would also apply similarly if the semiconductor surface layer 12 is an AlGaN layer that is a mixed crystal of GaN and AlN. Gallium oxide and aluminum oxide are formed on the surface of the AlGaN layer. The standard free energy of formation of the $SiO_2$ is smaller than the standard free energy of formation of the $Al_2O_3$ that is the aluminum oxide. Therefore, the excess silicon within the insulating film layer 25 reacts with the oxygen in the $Ga_2O_3$ and the $Al_2O_3$ and these oxides can be reduced.

As explained above, the oxide of the Group III element within the semiconductor surface layer 12 can be reduced and the collapse phenomenon can be inhibited by forming a silicon nitride film layer that has a larger silicon content than the stoichiometric composition on the semiconductor surface layer 12 as the insulating film layer 25, even in a structure where the semiconductor surface layer 12 between the gate electrode and the drain electrode is the AlGaN layer, such as in Patent Reference 1, a structure where the semiconductor surface layer 12 between the gate electrode and the drain electrode is the GaN layer, such as in Patent Reference 2, and a structure where the semiconductor surface layers 12 between the gate electrode and the drain electrode are the AlGaN layer and the GaN layer, such as in Patent Reference 3.

In addition, the insulating film layer 25 can not only be a silicon nitride film layer, but also a silicon oxide film or a silicon oxide nitride film that includes silicon. As long as the film has more silicon content that the stoichiometric composition, the excess silicon reacts with the oxygen in the $Ga_2O_3$ and the $Al_2O_3$ and these oxides can be reduced.

When the silicon oxide film is used, the silicon/oxygen composition ratio (the composition ratio of silicon to oxygen) must be 0.6 or more such that the silicon composition is greater than the stoichiometric composition ratio of 0.5. If the composition ratio is less than 0.6, for example, the density of the Si—H group is insufficient for $Ga_2O_3$ abstraction, and the effect of inhibiting the collapse phenomenon is reduced. In addition, if the silicon/oxygen composition ratio exceeds 3.0, silicon reacts with the oxygen in the atmosphere, as the silicon oxide film. In addition, the insulating film becomes amorphous silicon with metallic characteristics. Therefore, the silicon/oxygen composition ratio (the composition ratio of silicon to oxygen) of the silicon oxide film is preferably 0.6 or more and less than 3.0, and more preferably, 1.0 to 3.0.

The silicon oxide can be formed using the plasma CVD device under a condition where, for example, the flow rate of $SiH_4$ gas is 4 to 10 sccm, the flow rate of nitrogen dioxide ($NO_2$) gas is 2 to 15 sccm, the flow rate of nitrogen ($N_2$) gas is 20 to 500 sccm, and the high frequency power density is 0.03 to 0.3 $W/cm^2$.

When the silicon oxide nitride film is used, the silicon/nitrogen and oxygen composition ratio (the composition ratio of silicon to nitrogen and oxygen) of the silicon oxide nitride film must be 0.6 or more. If the composition ratio is less than 0.6, for example, the density of the Si—H group is insufficient for $Ga_2O_3$ abstraction, and the effect of inhibiting the collapse phenomenon is reduced. In addition, if the silicon/nitrogen and oxygen composition ratio exceeds 3.0, silicon reacts with the oxygen in the atmosphere, as occurs with the silicon nitride film. In addition, the insulating film becomes amorphous silicon with metallic characteristics. Therefore, the silicon/oxygen and nitrogen composition ratio (the composition ratio of silicon to oxygen and nitrogen) of the silicon oxide nitride film is preferably 0.6 or more and less than 3.0, and more preferably, 1.0 to 3.0.

The silicon oxide nitride film is formed using the parallel plate type plasma CVD device under a condition where, for example, the flow rate of $SiH_4$ gas is 4 to 10 sccm, the flow rate of nitrogen dioxide ($NO_2$) gas is 2 to 8 sccm, the flow rate of $N_2$ gas is 20 to 500 sccm, and the high frequency power density is 0.07 to 0.25 $W/cm^2$.

Furthermore, an aluminum nitride film layer and an aluminum oxide film layer that has more aluminum content than the stoichiometric composition can be used as the insulating film layer 25, to the $Ga_2O_3$ formed on the surface of the GaN layer as the semiconductor surface layer 12. The standard free energy of formation of $Al_2O_3$ is smaller than the standard free energy of formation of $Ga_2O_3$. Thus, the excess aluminum in the insulating film layer 25 reacts with the oxygen in the $Ga_2O_3$, and an effect where these oxides can be reduced is attained.

When the aluminum nitride film is used, the aluminum/nitrogen composition ratio of the aluminum nitride film must be 1.2 or more to be greater than the stoichiometric composition of 1.0. If the composition ratio is smaller than 1.2, for example, the density of dangling bond of Al is insufficient for $Ga_2O_3$ abstraction, and the effect of inhibiting the collapse phenomenon is reduced. In addition, if the aluminum/nitrogen composition ratio exceeds 2.0, aluminum reacts with the oxygen in the atmosphere, and the reaction with the oxide under the aluminum nitride film is reduced. Therefore, the aluminum/nitrogen composition ratio (the composition ratio of aluminum to nitrogen) of the silicon oxide nitride film is preferably 1.2 or more and less than 2.0, and more preferably, 1.5 to 2.0.

The aluminum nitride film is formed using a target composed of the aluminum nitride film and the sputtering method, under a condition where, for example, the flow rate of Ar gas is 20 to 100 sccm and the high frequency power is 100 to 200 W.

When using the aluminum oxide film, the aluminum/oxygen composition ratio of the aluminum oxide must be 0.7 or more to be greater than the stoichiometric composition of 0.67. If the composition ratio is smaller than 0.7, for example, the density of the dangling bond of Al is insufficient for $Ga_2O_3$ abstraction, and the effect of inhibiting the collapse phenomenon is reduced. In addition, if the aluminum/oxygen composition ratio exceeds 2.0, aluminum reacts with the oxygen in the atmosphere, and the reaction with the oxide under the aluminum nitride film is reduced. Therefore, the aluminum/oxygen composition ratio (the composition ratio of aluminum to oxygen) of the silicon oxide nitride film is preferably 0.7 or more and less than 2.0, and more preferably, 1.5 to 2.0.

The aluminum oxide film is formed using a target composed of the aluminum oxide film and the sputtering method, under a condition where, for example, the flow rate of Ar gas is 20 to 100 sccm and the high frequency power is 100 to 200 W.

In addition, because the standard free energy of formation of $In_2O_3$ is larger with regards to $Al_2O_3$ and $SiO_2$, an effect of reducing the oxide of indium can be attained when an InGaN layer is used in place of the GaN layer as the semiconductor surface layer 12 if the insulating film layer 25 is a film that includes more silicon or aluminum in excess than the stoichiometric composition.

As explained above, if the insulating film layer 25 formed on the semiconductor surface layer 12 meets the following conditions, the oxide of the Group III element formed within the semiconductor surface layer 12 can be reduced. As a result, the collapse phenomenon can be inhibited, and thus, a nitride semiconductor HEMT or a MESFET capable of high output operations can be provided.

Here, the conditions of the insulating film layer 25 are that the insulating film layer is that in which, when the standard free energy of formation of the oxide of the metal element composing the insulating film layer 25 is G1 and the standard free energy of formation of the oxide of the Group III element composing the semiconductor surface layer 12 is G2, G1<G2, and the content of the metal element is larger than the stoichiometric composition.

The present invention is not limited to the specifically disclosed embodiments, but include various other embodiments, variations and modification without departing from the scope of the present invention.

The present invention is based on Japanese Patent Application No. 2005-096902, and the entire disclosure of which is hereby incorporated by reference.

What is claimed is:

1. A semiconductor device comprising:
    a GaN-based semiconductor layer formed on a substrate, the GaN-based semiconductor layer including layers formed in order of a GaN channel layer, an AlGaN electron supply layer and GaN cap layer;
    a gate electrode formed on the GaN cap layer;
    a source electrode and a drain electrode formed on the GaN cap layer with the gate electrode there between; and
    an insulating film of 200 nm to 300 nm formed on the surface of the GaN cap layer between the source electrode and the gate electrode and between the gate electrode and the drain electrode, and composed of aluminum nitride in which the composition ratio of aluminum to nitrogen is 1.2 to 2.0 so that a collapse phenomenon does not occur even when drain voltage is applied so as to obtain a determined drain current.

* * * * *